United States Patent
Hsu et al.

(10) Patent No.: US 8,058,718 B2
(45) Date of Patent: Nov. 15, 2011

(54) PACKAGE SUBSTRATE EMBEDDED WITH SEMICONDUCTOR COMPONENT

(75) Inventors: Shih-Ping Hsu, Hsin-Chu (TW);
Kan-Jung Chia, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 262 days.

(21) Appl. No.: 12/340,405

(22) Filed: Dec. 19, 2008

(65) Prior Publication Data
US 2009/0166841 A1 Jul. 2, 2009

(30) Foreign Application Priority Data
Dec. 28, 2007 (TW) .............................. 96150713 A (51) Int. Cl.
*H01L 23/24* (2006.01)
(52) U.S. Cl. ................... 257/687; 257/E23.01
(58) Field of Classification Search .............. 257/690, 257/723, 778, E23.01, E21.502, E21.508, 257/678, 687, 700; 174/250, 255, 252
See application file for complete search history.

(56) References Cited

U.S. PATENT DOCUMENTS

| | | | |
|---|---|---|---|
| 6,586,276 B2 | 7/2003 | Towle et al. | |
| 2004/0004284 A1* | 1/2004 | Lee et al. | 257/737 |
| 2006/0087037 A1* | 4/2006 | Hsu | 257/738 |
| 2006/0090335 A1* | 5/2006 | Hsu et al. | 29/874 |

\* cited by examiner

*Primary Examiner* — Thomas L Dickey
*Assistant Examiner* — Nikolay Yushin
(74) *Attorney, Agent, or Firm* — Knobbe Martens Olson & Bear LLP (57) ABSTRACT

A package substrate embedded with a semiconductor component includes a substrate, a semiconductor chip, a first dielectric layer, a first circuit layer and first conductive vias. The substrate is formed with an opening for allowing the semiconductor chip to be secured therein. The semiconductor chip has an active surface and an inactive surface, wherein a plurality of electrode pads are formed on the active surface thereof and a passivation layer disposed thereon. The first dielectric layer is disposed both on the substrate and the passivation layer, wherein vias are formed at locations corresponding to those of the electrode pads and penetrating the dielectric layer and the passivation layer to expose the electrode pads therefrom. The first circuit layer is disposed on the first dielectric layer and electrically connected to the first conductive vias. The first conductive vias are disposed in the openings of the dielectric and passivation layers and the first circuit layer is electrically connected to the electrode pads, thereby allowing the first conductive vias to be electrically connected to the electrode pads of the chip.

11 Claims, 8 Drawing Sheets

PACKAGE SUBSTRATE EMBEDDED WITH SEMICONDUCTOR COMPONENT

FIELD OF THE INVENTION

The present invention relates to a semiconductor package substrate, and more particularly, to a package substrate embedded with a semiconductor component.

BACKGROUND OF THE INVENTION

As the semiconductor packaging technology advances, there have been developed various types of packages for semiconductor components. For example, one type of semiconductor component allows a semiconductor chip having an integrated circuit (IC) to be embedded in and electrically integrated with a package substrate. This semiconductor component may desirably reduce the overall size and improve the electrical functionality thereof, and thereby becomes widely adopted.

Figure 1A:
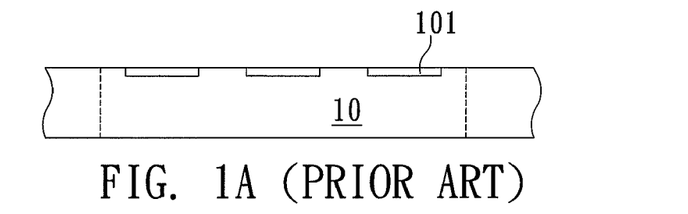
FIG. 1A is a cross-sectional view of a method for fabricating a traditional package substrate embedded with a semiconductor chip.
Figure 1B:
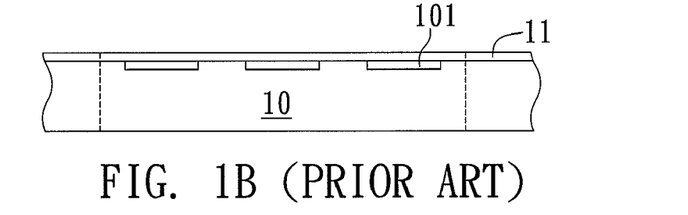
FIG. 1B is a cross-sectional view of a method for fabricating a traditional package substrate embedded with a semiconductor chip.
Figure 1C:
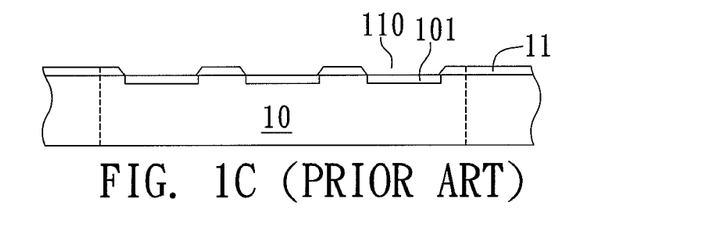
FIG. 1C is a cross-sectional view of a method for fabricating a traditional package substrate embedded with a semiconductor chip.
Figure 1D:
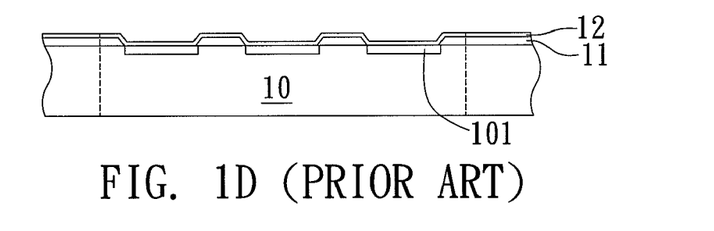
FIG. 1D is a cross-sectional view of a method for fabricating a traditional package substrate embedded with a semiconductor chip.
Figure 1E:
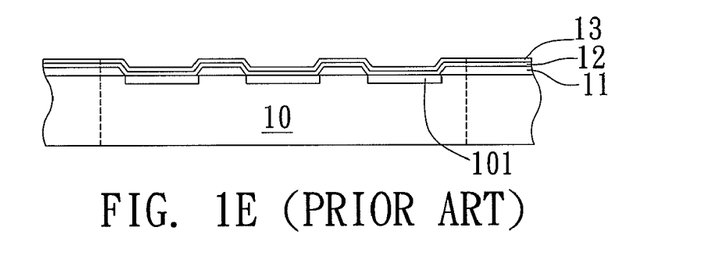
FIG. 1E is a cross-sectional view of a method for fabricating a traditional package substrate embedded with a semiconductor chip.
Figure 1F:
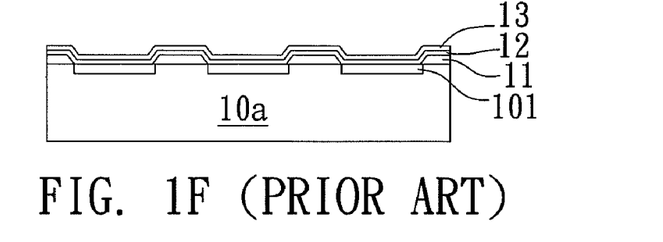
FIG. 1F is a cross-sectional view of a method for fabricating a traditional package substrate embedded with a semiconductor chip.
Figure 1G:
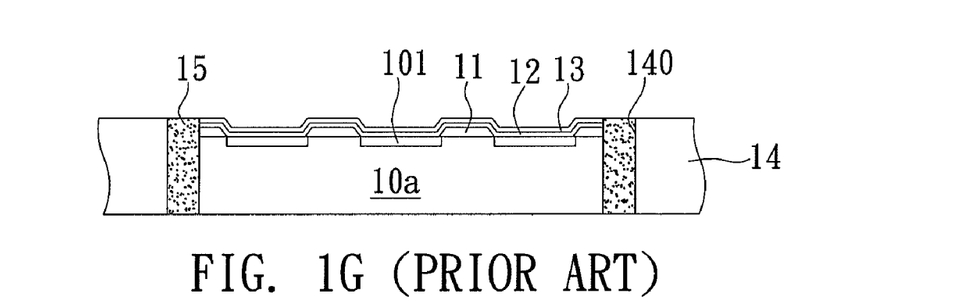
FIG. 1G is a cross-sectional view of a method for fabricating a traditional package substrate embedded with a semiconductor chip.
Figure 1H:
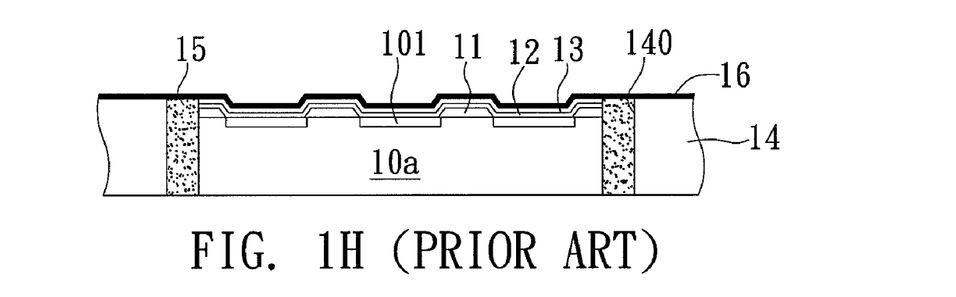
FIG. 1H is a cross-sectional view of a method for fabricating a traditional package substrate embedded with a semiconductor chip.
Figure 1I:
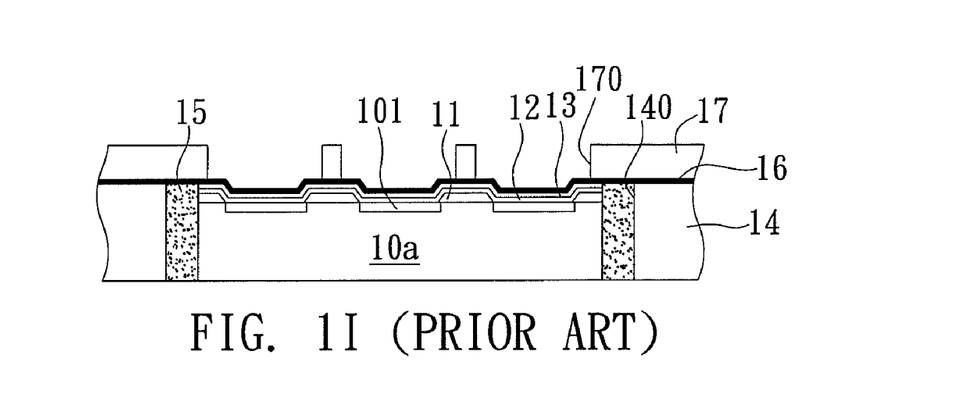
FIG. 1I is a cross-sectional view of a method for fabricating a traditional package substrate embedded with a semiconductor chip.
Figure 1J:
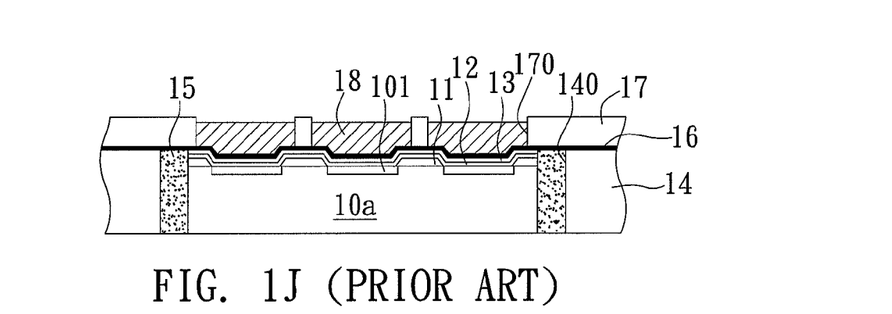
FIG. 1J is a cross-sectional view of a method for fabricating a traditional package substrate embedded with a semiconductor chip.
Figure 1K:
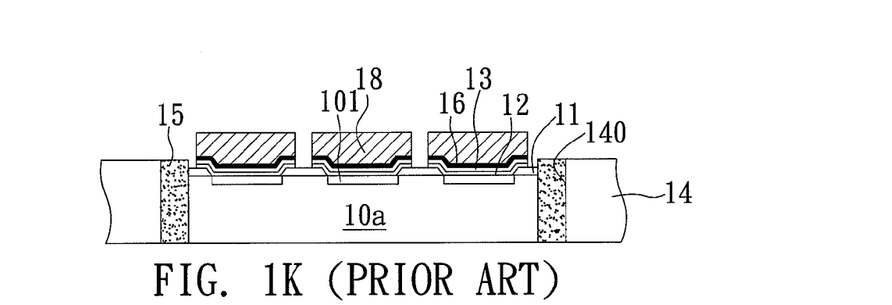
FIG. 1K is a cross-sectional view of a method for fabricating a traditional package substrate embedded with a semiconductor chip.
Figure 1L:
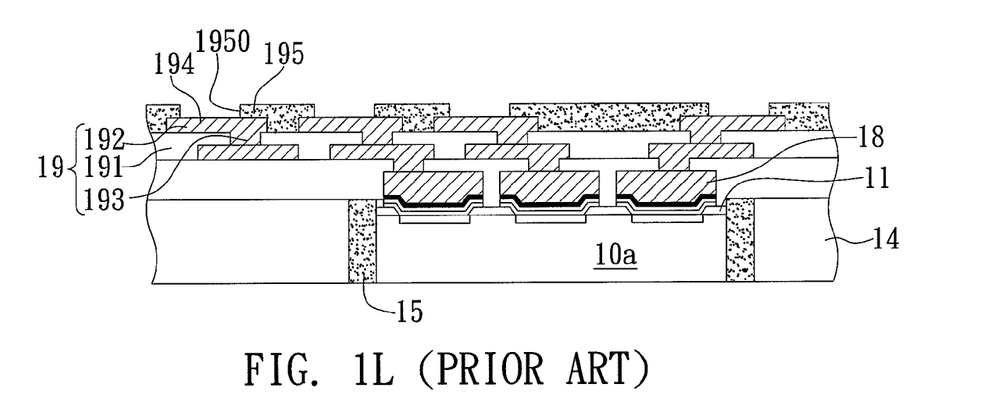
FIG. 1L is a cross-sectional view of a method for fabricating a traditional package substrate embedded with a semiconductor chip.

Referring to FIGS. 1A to 1L, a method for fabricating a conventional package substrate embedded with a semiconductor chip disclosed in U.S. Pat. No. 6,586,276 is shown. As shown in FIG. 1A, a wafer 10 having a plurality of electrode pads 101 is provided. As shown in FIG. 1B, a passivation layer is formed on the wafer 10. As in FIG. 1C, a first opening 110 is formed in the passivation layer 11 to expose the electrode pads 101. As shown in FIG. 1D, the passivation layer 11 and the exposed electrode pads 101 are covered with an adhesion layer 12. As shown in FIG. 1E, a protection layer 13 is then formed on the adhesion layer 12. As shown in FIG. 1F, the wafer 10 is cut to form a plurality of semiconductor chips 10a. As shown in FIG. 1G, a substrate 14 having an opening 140 is provided, and then one semiconductor chip 10a is placed into the opening 140 of the substrate 14 and secured there by a bonding material 15 formed in the gaps between the opening 140 of the substrate 14 and the semiconductor chip 10a. As shown in FIG. 1H, a conductive layer 16 is formed on top of the protection layer 13 of the semiconductor chip 10a, the bonding material 15 and the substrate 14. As shown in FIG. 1I, a resist layer 17 is then formed on the conductive layer 16 having resist openings 170 at locations corresponding to those of the electrode pads 101. As shown in FIG. 1J, expanded pads 18 are electroplated onto portions of the conductive layer 16 within the resist openings 170. As shown in FIG. 1K, the resist layer 17 and the underlying conductive layer 16, protection layer 13 and adhesion layer 12 are removed to expose the expanded pads and the passivation layer 11, wherein the expanded pads 18 are larger than the electrode pads 101 to facilitate alignment during subsequent lamination of a dielectric layer(s) and a circuit layer(s). As shown in FIG. 1L, finally, a circuit build-up structure 19 is then formed on the electrode pads 18, the passivation layer 11 and the substrate 14. The circuit build-up structure 19 includes at least a dielectric layer 191, a circuit layer 192 laminated on the dielectric layer and conductive vias 193 in the dielectric layer electrically connected with the expanded pads 18. The circuit build-up structure 19 further includes a plurality of conductive pads 194 on the surface thereof for electrically connecting the circuit layer 192. An insulating protective layer 195 is also formed on the circuit build-up structure 19 having a plurality of openings 1950 that correspondingly expose the conductive pads 194.

As can be seen from the above, regarding a conventional package substrate embedded with a semiconductor chip, before dicing the wafer 10 into a plurality of semiconductor chips 10a, an adhesion layer 12 has to be formed on the passivation layer 11 and the electrode pads 101, and then a protection layer 13 is formed on the adhesion layer 12. Although the adhesion layer 12 and the protection layer 13 facilitate subsequent processes of the semiconductor chip in the substrate, the exposed portions of the adhesion layer 12 and the protection layer 13 have to be removed before lamination of the dielectric layer 191 and the circuit layer 192 can be performed. As a result, the formation of the expanded pads 18 and electrically connection cannot be performed at the same time, which increases manufacturing cost and time. Furthermore, the electrically connecting structure including the expanded pads 18 and the conductive vias 192 is a complicated structure.

Therefore, there is a need for a package substrate embedded with a semiconductor component, which enables reduction of manufacturing costs and time as well as structural complexity.

SUMMARY OF THE INVENTION

In the light of forgoing drawbacks, an objective of the present invention is to provide a package substrate embedded with a semiconductor component.

Another objective of the present invention is to provide a package substrate embedded with a semiconductor component directly connecting vias with electrode pads of the semiconductor chip.

In accordance with the above and other objectives, the present invention discloses a package substrate embedded with a semiconductor component, comprising: a substrate having at least one opening; a semiconductor chip secured in the opening of the substrate having an active face with a plurality of electrode pads and a passivation layer disposed thereon and an inactive face opposite to the active face, wherein the passivation layer includes a first passivation layer with openings for exposing the electrode pads and a second passivation layer disposed on the first passivation layer and the electrode pads exposed from the openings; a first dielectric layer provided on the substrate and the passivation layer a plurality of vias penetrating the first dielectric layer and the second passivation layer, and being within the openings to thereby expose the electrode pads; a first circuit layer provided on the first dielectric layer; and a plurality of first conductive vias formed in the vias for electrically connecting the electrode pads and the first circuit layer.

Based on the above structure, the package substrate further comprises a bonding material disposed in gaps between the opening of the substrate and the semiconductor chip for securing the semiconductor in the opening. Alternatively, the substrate includes a first substrate body and a second substrate body having a respective opening for receiving the semiconductor chip secured therein by a bonding material disposed between the first and second substrate bodies and the opening. As yet another alternative, the semiconductor chip is placed in a carrier plate, and an encapsulating gel is formed on the carrier plate and the semiconductor chip to the level of the passivation layer, exposing the passivation layer while securing the semiconductor chip in the opening of the substrate formed by the carrier plate and the encapsulating gel.

According to embodiments of the present invention, the first dielectric layer is a thermosetting material. The passivation layer includes a first passivation layer with openings for exposing electrode pads and a second passivation layer on the first passivation layer and the electrode pads exposed from the openings. The first passivation layer is silicon nitride ($Si_3N_4$).

The second passivation layer is polyimide.

In a further embodiment, the package substrate further comprises a bonding material disposed in gaps between the opening of the substrate and the semiconductor chip for securing the semiconductor in the opening. Alternatively, the substrate includes a first substrate body and a second substrate body having a respective opening for receiving the semiconductor chip secured therein by a bonding material disposed between the first and second substrate bodies and the opening. As yet another alternative, the semiconductor chip is placed in a carrier plate, and an encapsulating gel is formed on the carrier plate and the semiconductor chip to the level of the passivation layer, exposing the passivation layer while securing the semiconductor chip in the opening of the substrate formed by the carrier plate and the encapsulating gel.

According to embodiments of the present invention, the first dielectric layer is a thermosetting material and the laser has a wavelength in the infrared range. The passivation layer includes a first passivation layer with openings for exposing electrode pads and a second passivation layer on the first passivation layer and the electrode pads exposed from the openings. The first passivation layer is silicon nitride ($Si_3N_4$). The second passivation layer is polyimide.

According to embodiments of the present invention, the passivation layer includes a first passivation layer with openings for exposing electrode pads and a second passivation layer on the first passivation layer and the electrode pads exposed from the openings. The first passivation layer is silicon nitride ($Si_3N_4$). The second passivation layer is polyimide.

According to embodiments of the present invention, the vias are consisting of down-part openings penetrating the second passivation layer and up-part openings penetrating the first dielectric layer, and the size of the down-part opening is smaller than that of the up-part opening.

The method for fabricating a package substrate embedded with a semiconductor chip of the present invention includes dicing a wafer having a plurality of electrode pads and covered by a passivation layer into a plurality of semiconductor chips and one semiconductor chip is placed in the substrate for subsequent processes. The passivation layer includes a first passivation layer with openings for exposing electrode pads and a second passivation layer on the first passivation layer and the electrode pads exposed from the openings. Then, a first dielectric layer is formed on the semiconductor chip and the substrate, wherein a plurality of vias penetrate the first dielectric layer and the second passivation layer are formed by laser drilling, or the plurality of vias consist of up-part openings first formed in the dielectric layer by photolithography techniques and down-part openings further formed in the second passivation layer by laser drilling, thereby exposing the electrode pads, wherein the semiconductor chip is placed into the substrate before exposing the electrode pads, thus avoiding oxidation of the pads during processing. In addition, the laser has a wavelength in the infrared range, which avoids damage of the electrode pads since infrared laser has relatively lower energy, and the second passivation layer is selected to be a material that easily absorbs laser energy, such as polyimide. Thus, a lower-energy laser can be used in forming vias or openings in the passivation layer without damaging the electrode pads. Thereafter, first conductive vias directly connected to the electrode pads are formed. Compared to the prior art where the expanded pads are formed before formation of the conductive vias, the present invention enables protection of the electrode pads of the semiconductor chip, direct electrical connection and reduction of process steps.

BRIEF DESCRIPTION OF THE DRAWINGS

The present invention can be more fully understood by reading the following detailed description of the preferred embodiments, with reference made to the accompanying drawings, wherein:

FIG. 3B' is the other implementation of FIG. 3B;

FIG. 3B" is the other implementation of FIG. 3B;

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

First Embodiment

Referring to FIGS. 2A to 2C and 3A to 3H, a method for fabricating a package substrate embedded with a semiconductor component according to a first embodiment of the present invention are shown.

Figure 2A:
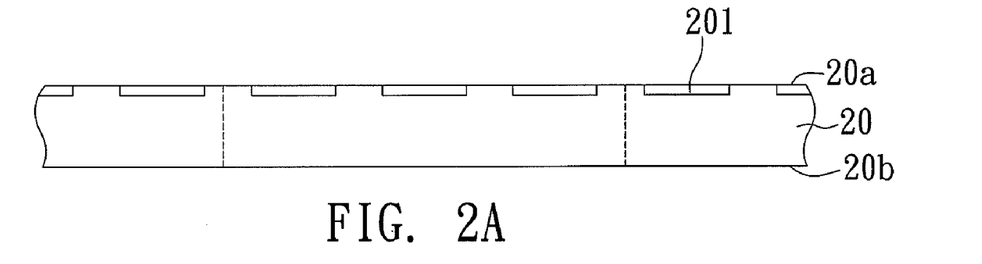
FIG. 2A is a cross-sectional view showing a method for fabricating a passivation layer on an active face of a wafer according to an embodiment of the present invention.
Figure 2B:
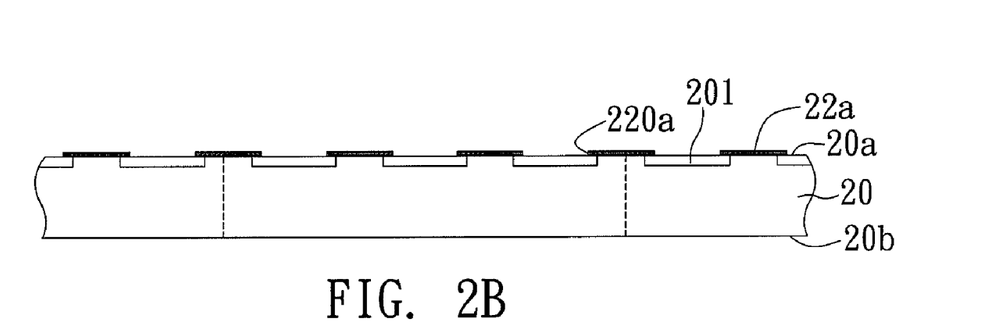
FIG. 2B is a cross-sectional view showing a method for fabricating a passivation layer on an active face of a wafer according to an embodiment of the present invention.
Figure 2C:
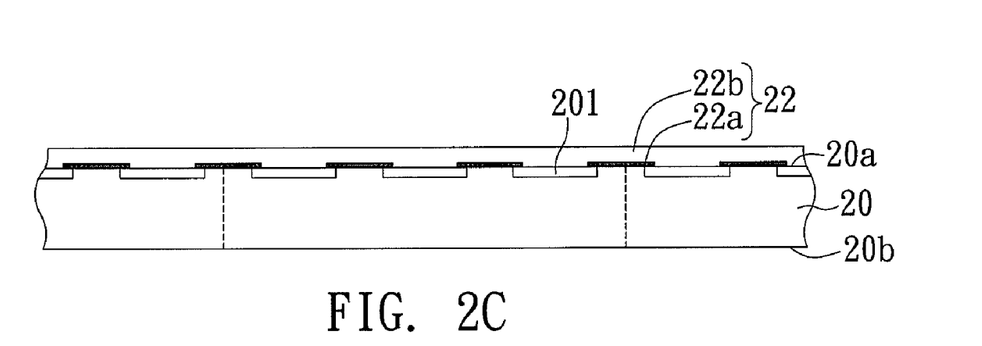
FIG. 2C is a cross-sectional view showing a method for fabricating a passivation layer on an active face of a wafer according to an embodiment of the present invention.

Referring to FIGS. 2A to 2C, a method for fabricating a passivation layer on a wafer is shown.

As shown in FIG. 2A, a wafer 20 having an active face 20a and an inactive face 20b opposite to each other is provided. A plurality of electrode pads 201 are formed on the active face 20a.

As shown in FIG. 2B, a first passivation layer 22a, such as silicon nitride ($Si_3N_4$), is formed on the active face 20a of the wafer 20 having a plurality of openings 220a to expose partial surfaces of the electrode pads 202.

As shown in FIG. 2C, a second passivation layer 22b, such as polyimide, is formed on the electrode pads 201 and the first passivation layer 22a. The first and second passivation layers 22a and 22b constitute a passivation layer 22.

Referring to FIGS. 3A to 3H, cross-sectional views illustrating a semiconductor chip embedded in a package substrate are shown.

Figure 3A:
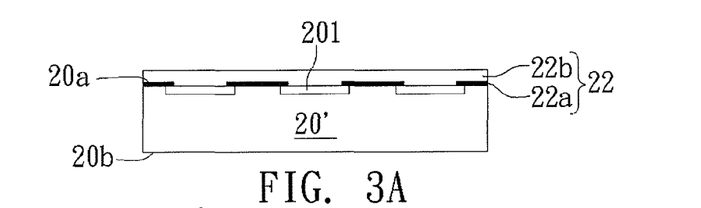
FIG. 3A is a cross-sectional view of a method for fabricating a package substrate embedded with a semiconductor component according to a first embodiment of the present invention.

As shown in FIG. 3A, a wafer 20 as shown in FIG. 2C is provided, which is diced into a plurality of semiconductor chips 20'. Each semiconductor chip 20' has an active face 20a and an inactive face 20b opposite to each other. A plurality of electrode pads 201 and the passivation layer 22 are formed on the active face 20a.

Figure 3B:
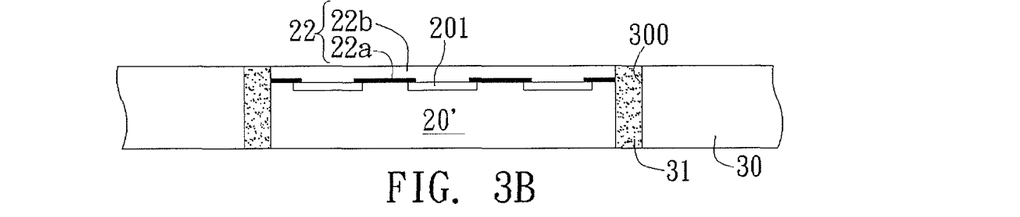
FIG. 3B is a cross-sectional view of a method for fabricating a package substrate embedded with a semiconductor component according to a first embodiment of the present invention.

As shown in FIGS. 3B, 3B' and 3B", a substrate 30 having an opening 300 is provided. The semiconductor chip 20' is secured in the opening 300 by a bonding material 31 as depicted in FIG. 3B. Alternatively, the bonding material 31 is applied between a first substrate body 30a and a second substrate body 30b constituting the substrate body 30, each body having a respective opening 300 for receiving the semiconductor chip 20', and the bodies are squeezed such that the bonding material 31 are forced into the openings 300 to secure the chip 20' in the openings 300, as indicated in FIG. 3B'. As yet another alternative, a carrier plate 30c is provided for placing the semiconductor chip 20' thereon. A packing gel 30d is then formed on the carrier plate 30c to the level of the passivation layer 22 of the semiconductor chip 20', so as to encapsulate the chip 20' in the gel 30d while exposing the passivation layer 22. As a result, the chip 20' is secured in an opening 300 of a substrate 30 formed by the carrier plate 30c and the encapsulating gel 30d, as shown in FIG. 3B". Descriptions will be made in the context of the structure in FIG. 3B hereinafter.

Figure 3C:
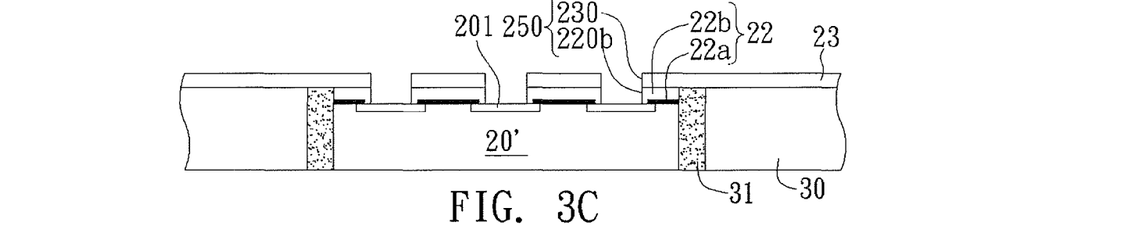
FIG. 3C is a cross-sectional view of a method for fabricating a package substrate embedded with a semiconductor component according to a first embodiment of the present invention.

As shown in FIG. 3C, a first dielectric layer 23 is formed on top of the substrate 30 and the passivation layer 22. At locations corresponding to those of the electrode pads, a plurality of vias 250 penetrating the first dielectric layer 23 and the second passivation layer 22b are formed by, for example, laser drilling, thereby exposing partial surfaces of the electrode pads 201. The vias 250 each have a down-part opening 220b penetrating the second passivation layer 22b and an up-part opening 230 penetrating the first dielectric layer 23, and the size of the down-part opening 220b is equal to that of the up-part opening 230. The laser used has a wavelength in the infrared range. The electrode pads 201 can be prevented from damaging by the laser, since such infrared laser has relative lower energy. The first dielectric layer 23 is a thermosetting material, such as polyimide, that absorbs laser energy readily, allowing the use of lower-energy laser to form vias 250 without damaging the electrode pads 201.

Figure 3D:
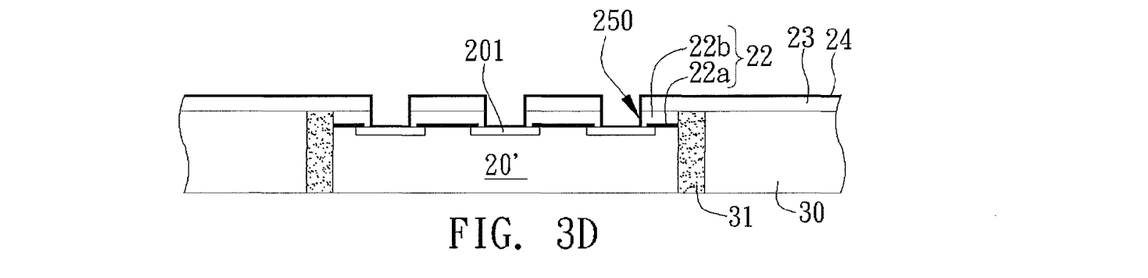
FIG. 3D is a cross-sectional view of a method for fabricating a package substrate embedded with a semiconductor component according to a first embodiment of the present invention.

As shown in FIG. 3D, a conductive layer 24 is formed on the electrode pads 201, the first dielectric layer 23 and the vias 250. It is used mainly as an electrical conduction path for subsequent electroplating of metal materials. It can be constituted of a metal layer, an alloy layer, or a plurality of metal layers or conducting polymer materials.

Figure 3E:
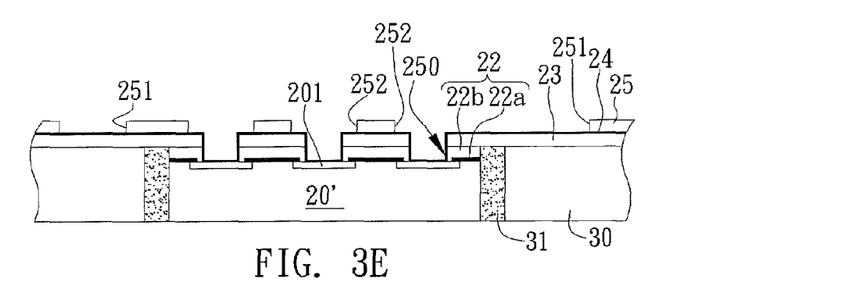
FIG. 3E is a cross-sectional view of a method for fabricating a package substrate embedded with a semiconductor component according to a first embodiment of the present invention.

As shown in FIG. 3E, a resist layer 25 is formed on the conductive layer 24. The resist layer 25 is a dry or wet photoresist that is printed, spin coated or adhered to the surface of the conductive layer and patterned through lithography techniques (e.g. exposure and development etc.). First openings 251 and second openings 252 are formed in the resist layer 25, wherein the second openings 252 correspond to the locations of the electrode pads 201, and the size of the second openings 252 is larger than that of the vias 250, exposing the conductive layer 24 on top of the electrode pads 201. The first openings 251 are connected with the second openings 252.

Figure 3F:
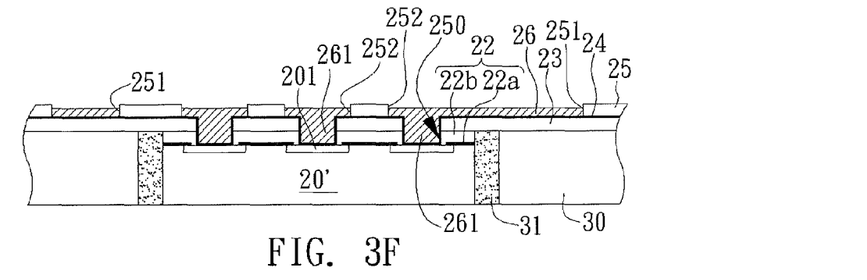
FIG. 3F is a cross-sectional view of a method for fabricating a package substrate embedded with a semiconductor component according to a first embodiment of the present invention.

As shown in FIG. 3F, an electroplating process is performed on the conductive layer 24 in the first and second openings 251 and 252, using the conductive layer 24 as an electrical conduction path, thereby forming a first circuit layer 26 on the conductive layer 24 in the first openings 251, and forming first conductive vias 261 on the conductive layer in the second openings 252 and vias 250. The conductive vias 261 are electrically connected to the electrode pads 201 of the semiconductor chip 20'. The first circuit layer 26 is electrically connected to the first conductive vias 261.

Figure 3G:
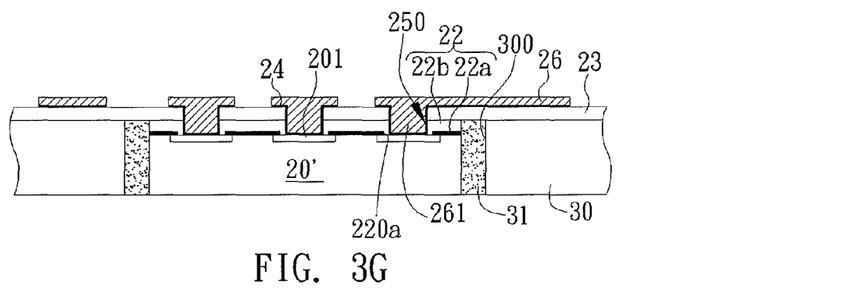
FIG. 3G is a cross-sectional view of a method for fabricating a package substrate embedded with a semiconductor component according to a first embodiment of the present invention.

As shown in FIG. 3G, the resist layer 25 and the underlying conductive layer 24 are removed to expose the first circuit layer 26 and the first dielectric layer 23.

Figure 3H:
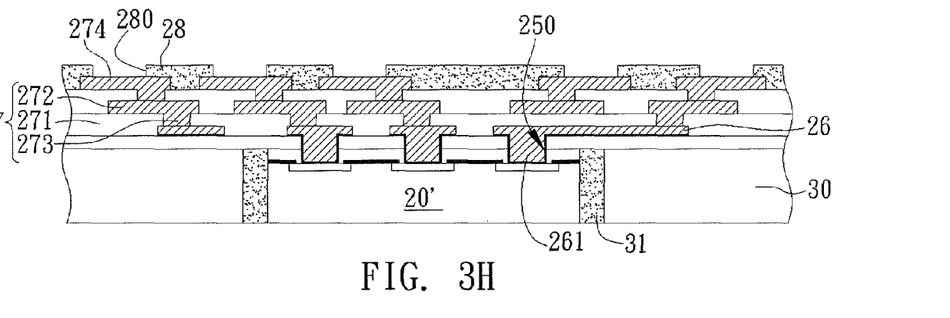
FIG. 3H is a cross-sectional view of a method for fabricating a package substrate embedded with a semiconductor component according to a first embodiment of the present invention.

As shown in FIG. 3H, a circuit build-up structure 27 is further formed on the first circuit layer 26 and the first dielectric layer 23, including at least a second dielectric layer 271, a second circuit layer 272 disposed on the second dielectric layer and conductive vias 273 in the second dielectric layer electrically connected with the first and second circuit layers. The circuit build-up structure further includes a plurality of conductive pads 274 on the surface thereof for electrically connecting to the second circuit layer 272. An insulating protective layer 28 is also formed on the circuit build-up structure 27 having a plurality of openings 280 that correspondingly expose the conductive pads 274.

As shown in FIG. 3G the present invention discloses a package substrate embedded with a semiconductor component, which includes: a substrate 30 having at least one opening 300; a semiconductor chip 20' secured in the opening 300 of the substrate 30 by a bonding material 31 in gaps between the semiconductor chip 20' and the opening 300; or the semiconductor chip 20' received in the opening 300 of the substrate 30 constituted from a first substrate body 30a and a second substrate body 30b and secured by a bonding material 31 provided between the first and second substrate bodies 30a and 30b and the opening 300; or the semiconductor chip 20' secured in the opening 300 formed by a carrier plate 30c and an encapsulating gel 30a, wherein the semiconductor chip 20' is placed on the carrier plate 30c and encapsulated by the encapsulating gel 30a; the semiconductor chip 20' having an active face 20a with a plurality of electrode pads 201 and a passivation layer 22 disposed on the active face 20a of the chip 20', the passivation layer 22 being constituted of a first passivation layer 22a having openings 220a for exposing the electrode pads 201 and a second passivation layer 22b on the first passivation layer 22a and the electrode pads 201 exposed from the openings 220a, the first passivation layer 22a being silicon nitride ($Si_3N_4$), the second passivation layer 22b being polyimide; a first dielectric layer 23 disposed on the substrate 30 and the passivation layer 22; a plurality of vias 250 penetrating the first dielectric layer 23 and the second passivation layer 22b, and being within the openings 220a to thereby expose the electrode pads 201, the first dielectric layer 23 being a thermosetting material; a first circuit layer 26 provided on the first dielectric layer 23; and a plurality of first conductive vias 261 formed in the vias 250 and electrically connected with the electrode pads 201, the first circuit layer 26 being electrically connected with the first conductive vias 261.

Second Embodiment

Referring to FIGS. 4A to 4G, cross-sectional views of a method for fabricating a package substrate embedded with a semiconductor component according to a second embodiment of the present invention are shown. The second embodiment is similar to the first embodiment, but the main difference lies in the dielectric layer and its openings on the substrate and the semiconductor chip.

Figure 4A:
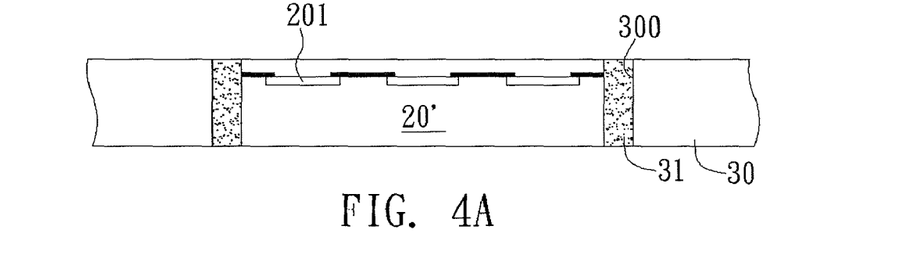
FIG. 4A is a cross-sectional view of a method for fabricating a package substrate embedded with a semiconductor component according to a second embodiment of the present invention.

As shown in FIG. 4A, a structure shown in FIGS. 3B, 3B' or 3B" is provided. The structure shown in FIG. 3B is used for illustration purpose.

Figure 4B:
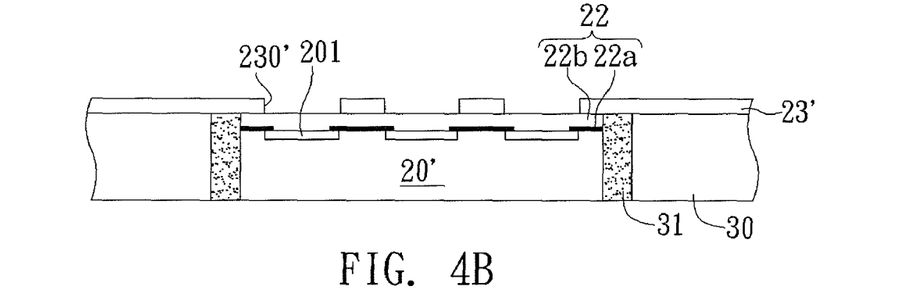
FIG. 4B is a cross-sectional view of a method for fabricating a package substrate embedded with a semiconductor component according to a second embodiment of the present invention.

As shown in FIG. 4B, a first dielectric layer 23' made of a photosensitive material is formed on top of the substrate 30 and the passivation layer 22 by printing, spin coating or adhesion. Up-part openings 230' of the first dielectric layer 23 are formed at locations corresponding to those of the electrode pads 201 by lithography techniques such as exposure and development.

Figure 4C:
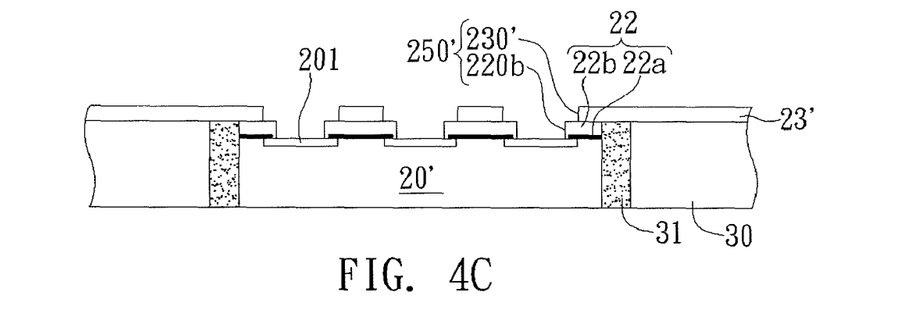
FIG. 4C is a cross-sectional view of a method for fabricating a package substrate embedded with a semiconductor component according to a second embodiment of the present invention.

As shown in FIG. 4C, down-part openings 220b are then formed in the second passivation layer 22b within the up-part openings 230' to expose the electrode pads 201, wherein the laser has a wavelength in the infrared range. Therefore, vias 250' are formed, consisting of the down-part opening 220b penetrating the second passivation layer 22b and the up-part opening 230' penetrating the first dielectric layer 23, and the size of the down-part opening 220b is smaller than that of the up-part opening 230'.

Figure 4D:
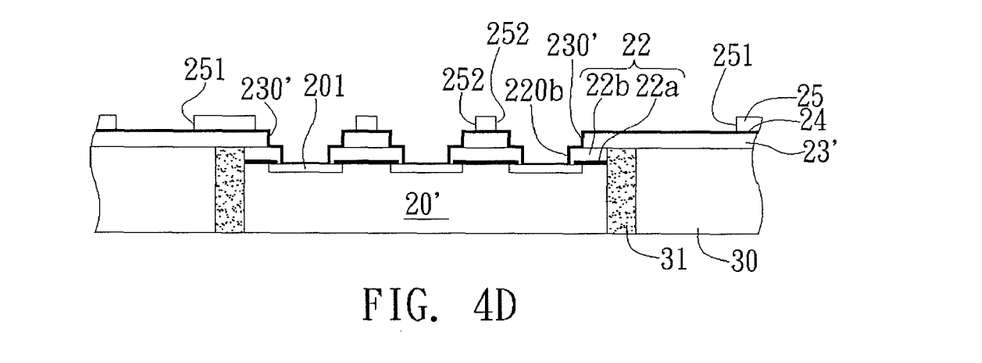
FIG. 4D is a cross-sectional view of a method for fabricating a package substrate embedded with a semiconductor component according to a second embodiment of the present invention.

As shown in FIG. 4D, a conductive layer 24 is formed on the electrode pads 201, the first dielectric layer 23', the up-part openings 230' and the down-part openings 220b. Then, a resist layer 25 is formed on the conductive layer 24 having first openings 251 to expose partial conductive layer 24 on the substrate 30 and second openings 252 to expose the electrode pads 201, the up-part openings 230' of the first dielectric layer 23 and portions of the conductive layer 24 in the down-part openings 220b of the second passivation layer 22b, wherein the first and second openings 251, 252 are connected to each other.

Figure 4E:
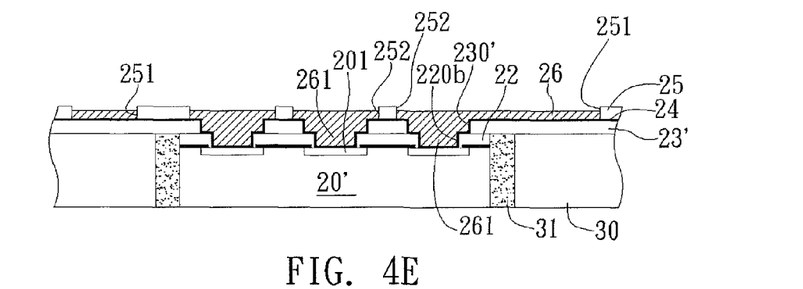
FIG. 4E is a cross-sectional view of a method for fabricating a package substrate embedded with a semiconductor component according to a second embodiment of the present invention.

As shown in FIG. 4E, a first build-up layer 26 is electroplated in the first openings 251, and first conductive vias 261 are electroplated onto the conductive layer 24 in the second openings 252 to electrically connect with the electrode pads 201. The first circuit layer 26 is electrically connected to the first conductive vias 261.

Figure 4F:
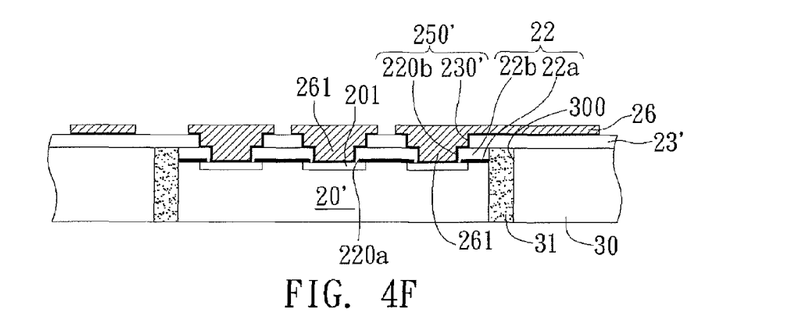
FIG. 4F is a cross-sectional view of a method for fabricating a package substrate embedded with a semiconductor component according to a second embodiment of the present invention.

As shown in FIG. 4F, the resist layer 25 and the underlying conductive layer 24 are removed to expose the first circuit layer 26 and the first dielectric layer 23'.

Figure 4G:
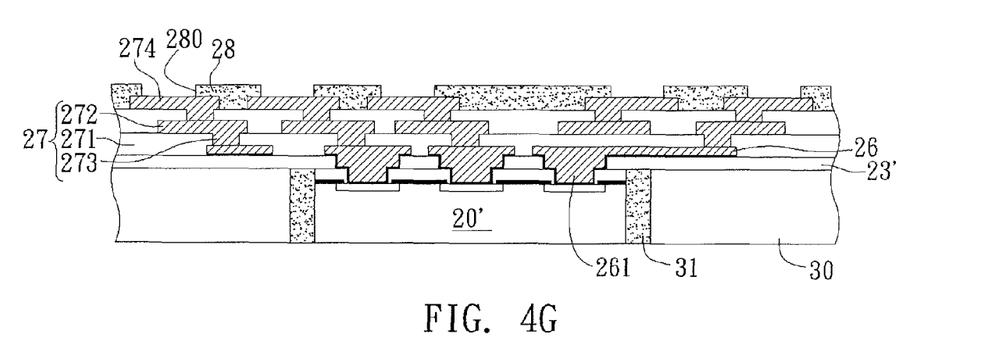
FIG. 4G is a cross-sectional view of a method for fabricating a package substrate embedded with a semiconductor component according to a second embodiment of the present invention.

As shown in FIG. 4G, a circuit build-up structure 27 is further formed on the first circuit layer 26 and the first dielectric layer 23, including at least a second dielectric layer 271, a second circuit layer 272 disposed on the second dielectric layer 271 and conductive vias 273 in the second dielectric layer 271 electrically connected with the first and second circuit layers 26, 272. The circuit build-up structure 27 further includes a plurality of conductive pads 274 on the surface thereof for electrically connecting to the second circuit layer 272. An insulating protective layer 28 is also formed on the circuit build-up structure 27 having a plurality of openings 280 that correspondingly expose the conductive pads 274.

As shown in FIG. 4F, the present invention discloses a package substrate embedded with a semiconductor component, which includes: a substrate 30 having at least one opening 300; a semiconductor chip 20' secured in the opening 300 of the substrate 30 by a bonding material 31 in gaps between the semiconductor chip 20' and the opening 300; or the semiconductor chip 20' received in the opening 300 of the substrate 30 constituted from a first substrate body 30a and a second substrate body 30b and secured by a bonding material 31 provided between the first and second substrate bodies 30a and 30b and the opening 300; or the semiconductor chip 20' secured in the opening 300 formed by a carrier plate 30c and an encapsulating gel 30a, wherein the semiconductor chip 20' is placed on the carrier plate 30c and encapsulated by the encapsulating gel 30a; the semiconductor chip 20' having an active face 20a with a plurality of electrode pads 201 and a passivation layer 22 disposed on the active face 20a of the chip 20', the passivation layer 22 being constituted of a first passivation layer 22a having openings 220a for exposing the electrode pads 201 and a second passivation layer 22b on the first passivation layer 22a and the electrode pads 201 exposed from the openings 220a, the first passivation layer 22a being silicon nitride ($Si_3N_4$), the second passivation layer 22b being polyimide; a first dielectric layer 23' disposed on the substrate 30 and the passivation layer 22; a plurality of vias 250' penetrating the first dielectric layer 23' and the second passivation layer 22b, and being within the openings 220a to thereby expose the electrode pads 201, the first dielectric layer 23' being a thermosetting material; a first circuit layer 26 provided on the first dielectric layer 23'; and a plurality of first conductive vias 261 formed in the vias 250' and electrically connected with the electrode pads 201, the first circuit layer 26 being electrically connected with the first conductive vias 261.

The vias 250' consist of the down-part opening 220b penetrating the second passivation layer 22b and the up-part opening 230' penetrating the first dielectric layer 23, and the size of the down-part opening 220b is smaller than that of the up-part opening 230'.

The method for fabricating a package substrate embedded with a semiconductor chip of the present invention includes dicing a wafer having a plurality of electrode pads and covered by a passivation layer into a plurality of semiconductor chips and one semiconductor chip is placed in the substrate for subsequent processes. The passivation layer includes a first passivation layer with openings for exposing electrode pads and a second passivation layer on the first passivation layer and the electrode pads exposed from the openings. Then, a first dielectric layer is formed on the semiconductor chip and the substrate, wherein a plurality of vias penetrate the first dielectric layer and the second passivation layer are formed by laser drilling, or the plurality of vias consist of up-part openings first formed in the dielectric layer by photolithography techniques and own-part openings further formed in the second passivation layer by laser drilling, thereby exposing the electrode pads, wherein the semiconductor chip is placed into the substrate before exposing the electrode pads, thus avoiding oxidation of the pads during processing. In addition, the laser has a wavelength in the infrared range, which avoids damage of the electrode pads since infrared laser has relatively lower energy, and the second passivation layer is selected to be a material that easily absorbs laser energy, such as polyimide. Thus, a lower-energy laser can be used in forming vias or openings in the passivation layer without damaging the electrode pads. Thereafter, first conductive vias directly connected to the electrode pads are formed. Compared to the prior art where the expanded pads are formed before formation of the conductive vias, the present invention enables protection of the electrode pads of the semiconductor chip, direct electrical connection and reduction of process steps.

The above embodiments illustrate the principles of the present invention, and they should not be construed as to limit the present invention in any way. The above embodiments can be modified by those with ordinary skills in the art without departing from the scope of the present invention as defined in the following appended claims.

What is claimed is:

1. A package substrate embedded with a semiconductor component, comprising:
a substrate having at least one opening;
a semiconductor chip secured in the opening of the substrate having an active face with a plurality of electrode pads and a passivation layer disposed thereon and an inactive face opposite to the active face, wherein the passivation layer includes a first passivation layer with openings for exposing the electrode pads and a second passivation layer disposed on the first passivation layer and the electrode pads exposed from the openings;
a first dielectric layer provided on the substrate and the passivation layer;
a plurality of vias penetrating the first dielectric layer and the second passivation layer, and being within the openings to expose the electrode pads;
a first circuit layer provided on the first dielectric layer; and
a plurality of first conductive vias formed in the vias for electrically connecting the electrode pads and the first circuit layer.

2. The package substrate embedded with a semiconductor component of claim 1, further comprising a bonding material disposed in gaps between the opening of the substrate and the semiconductor chip for securing the semiconductor chip in the opening.

3. The package substrate embedded with a semiconductor component of claim 1, wherein the substrate includes a first substrate body and a second substrate body having a respective opening for receiving the semiconductor chip secured therein by a bonding material disposed between the first and second substrate bodies and the opening.

4. The package substrate embedded with a semiconductor component of claim 1, wherein the semiconductor chip is placed in a carrier plate, and an encapsulating gel is formed on the carrier plate and the semiconductor chip to the level of the passivation layer, exposing the passivation layer while securing the semiconductor chip in the opening of the substrate formed by the carrier plate and the encapsulating gel.

5. The package substrate embedded with a semiconductor component of claim 1, wherein the first dielectric layer is a thermosetting material.

6. The package substrate embedded with a semiconductor component of claim 1, wherein the first passivation layer is silicon nitride ($Si_3N_4$).

7. The package substrate embedded with a semiconductor component of claim 1, wherein the second passivation layer is polyimide.

8. The package substrate embedded with a semiconductor component of claim 1, wherein the vias consist of down-part openings penetrating the second passivation layer and up-part openings penetrating the first dielectric layer, and the size of the down-part opening is smaller than that of the up-part opening.

9. The package substrate embedded with a semiconductor component of claim 1, further comprising: a circuit build-up structure formed on the first circuit layer and the first dielectric layer.

10. The package substrate embedded with a semiconductor component of claim 9, wherein the circuit build-up structure including at least a second dielectric layer, a second circuit layer disposed on the second dielectric layer, conductive vias formed in the second dielectric layer electrically connected with the first and second circuit layers and a plurality of conductive pads disposed on the circuit build-up structure surface for electrically connecting to the second circuit layer.

11. The package substrate embedded with a semiconductor component of claim 10, an insulating protective layer is formed on the circuit build-up structure having a plurality of openings that correspondingly expose the conductive pads.

* * * * *